United States Patent
Park et al.

(10) Patent No.: US 9,659,710 B2
(45) Date of Patent: May 23, 2017

(54) MULTILAYER CERAMIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Heung Kil Park, Suwon-Si (KR); Sang Soo Park, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 94 days.

(21) Appl. No.: 14/860,309

(22) Filed: Sep. 21, 2015

(65) Prior Publication Data

US 2016/0212843 A1    Jul. 21, 2016

(30) Foreign Application Priority Data

Jan. 20, 2015 (KR) .................. 10-2015-0009325

(51) Int. Cl.

| H01G 4/01 | (2006.01) |
|---|---|
| H05K 1/18 | (2006.01) |
| H01G 4/30 | (2006.01) |
| H05K 3/34 | (2006.01) |
| H01G 2/06 | (2006.01) |
| H01G 4/232 | (2006.01) |

(52) U.S. Cl.
CPC .............. *H01G 4/01* (2013.01); *H01G 2/06* (2013.01); *H01G 4/232* (2013.01); *H01G 4/30* (2013.01); *H05K 1/181* (2013.01); *H05K 3/3442* (2013.01); *H05K 2201/10015* (2013.01); *H05K 2201/10946* (2013.01); *H05K 2201/2045* (2013.01); *Y02P 70/611* (2015.11); *Y02P 70/613* (2015.11)

(58) Field of Classification Search
CPC ..................................... H05K 3/3452
USPC ......................................... 174/260
See application file for complete search history.

(56) References Cited

U.S. PATENT DOCUMENTS

| 2003/0161089 A1 | 8/2003 | Togashi |
| 2010/0123995 A1 | 5/2010 | Otsuka et al. |

FOREIGN PATENT DOCUMENTS

| JP | 11-251176 A | 9/1999 |
| JP | 2003-257784 A | 9/2003 |
| JP | 2010-123614 A | 6/2010 |

*Primary Examiner* — Hoa C Nguyen
*Assistant Examiner* — Stanley Tso
(74) *Attorney, Agent, or Firm* — McDermott Will & Emery LLP (57) ABSTRACT

A multilayer ceramic component includes a multilayer ceramic capacitor including a ceramic body including a plurality of first and second internal electrodes, and first and second external electrodes, first and second insulation frames respectively including first and second horizontal insulation portions and first and second vertical insulation portions, first and second external conductive electrodes including first and second horizontal conductive portions and first and second vertical conductive portions, first and second internal conductive electrodes disposed on internal surfaces of the first and second vertical insulation portions and connected to the first and second external electrodes, and electrical connection portions.

12 Claims, 9 Drawing Sheets

FIG. 9

MULTILAYER CERAMIC COMPONENT AND BOARD HAVING THE SAME

CROSS-REFERENCE TO RELATED APPLICATION

This application claims the priority and benefit of Korean Patent Application No. 10-2015-0009325 filed on Jan. 20, 2015, with the Korean Intellectual Property Office, the disclosure of which is incorporated herein by reference.

BACKGROUND

The present disclosure relates to a multilayer ceramic component and a board having the same.

Electronic components commonly including ceramic materials include capacitors, inductors, varistors, thermistors, and the like, in addition to piezoelectric elements.

Multilayer ceramic capacitors (MLCCs), frequently used to form such ceramic electronic components, may be used in various electronic apparatuses due to advantages thereof such as a small size, high capacitance, and ease of mounting.

For example, multilayer ceramic capacitors may be used as chip-type condensers mounted on the boards of various electronic products such as display devices including liquid crystal displays (LCDs), plasma display panels (PDPs), and the like, computers, personal digital assistants (PDAs), mobile phones, and the like, serving to charge electricity in such devices and discharge electricity therefrom.

Such multilayer ceramic capacitors may have structures in which a plurality of dielectric layers and internal electrodes, disposed between the dielectric layers and having different polarities, are alternately disposed.

In this case, since the dielectric layers have piezoelectric properties, when a direct current (DC) or alternating current (AC) voltage is applied to the multilayer ceramic capacitor, a piezoelectric phenomenon may occur between the internal electrodes to generate periodic vibrations while a volume of a ceramic body is expanded and contracted depending on a frequency thereof.

These vibrations may be transferred to a board through external electrodes of the multilayer ceramic capacitor and solders connecting the external electrodes to the board, such that an entire board may act as a sound reflecting surface to transmit the sound of vibrations as noise.

The sound of vibrations may correspond to an audio frequency within the range of 20 to 20,000 Hz, a frequency potentially causing user discomfort. Vibration noise causing listener discomfort, as described above, is commonly known as acoustic noise.

Further, modern electronic devices are commonly provided with relatively silent mechanical components, and thus, acoustic noise generated in multilayer ceramic capacitors may be more prominent.

In a case in which a device is operated in a silent environment, the user may believe the acoustic noise to be a fault of the device.

In addition, when audio output of a device having an audio circuit overlaps with acoustic noise therefrom, the quality of the device may be deteriorated.

SUMMARY

An aspect of the present disclosure may provide a multilayer ceramic component reducing acoustic noise, and a board having the same.

According to an aspect of the present disclosure, a multilayer ceramic component may include: a multilayer ceramic capacitor including a ceramic body including a plurality of first and second internal electrodes alternately exposed to opposite end surfaces of the ceramic body in a length direction with respective dielectric layers interposed between the plurality of first and second internal electrodes, and first and second external electrodes disposed to be connected to the first and second internal electrodes, respectively, on the opposite end surfaces of the ceramic body in the length direction; first and second insulation frames respectively including first and second horizontal insulation portions disposed on portions of the ceramic body in a thickness direction, and first and second vertical insulation portions extended perpendicularly from end portions of the first and second horizontal insulation portions of the first and second insulation frames, respectively, and disposed on the opposite end surfaces of the ceramic body in the length direction, respectively; first and second external conductive electrodes respectively including first and second horizontal conductive portions disposed on external surfaces of the first and second horizontal insulation portions of the first and second insulation frames, respectively, and first and second vertical conductive portions disposed on external surfaces of the first and second vertical insulation portions of the first and second insulation frames, respectively; first and second internal conductive electrodes disposed on internal surfaces of the first and second vertical insulation portions of the first and second insulation frames and connected to the first and second external electrodes, respectively; and electrical connection portions connecting the first and second vertical conductive portions of the first and second external conductive electrodes and the first and second internal conductive electrodes to each other, respectively.

According to another aspect of the present disclosure, a board having a multilayer ceramic component may include: a circuit board on which first and second electrode pads are provided; and the multilayer ceramic component as described above, mounted on the circuit board so that the first and second horizontal conductive portions of the first and second external conductive electrodes are connected to the first and second electrode pads.

According to another aspect of the present disclosure, a multilayer ceramic component may include: a multilayer ceramic capacitor including a ceramic body including a plurality of first and second internal electrodes alternately exposed to opposite end surfaces of the ceramic body in a length direction with respective dielectric layers interposed between the plurality of first and second internal electrodes, and first and second external electrodes disposed on the opposite end surfaces of the ceramic body which the plurality of the first and second internal electrodes are exposed to; first and second external conductive electrodes disposed on the first and second external electrodes, respectively; first and second electrical insulation frames disposed between the first and second external electrodes and the first and second external conductive electrodes, respectively; and first and second internal conductive electrodes disposed between the first and second electrical insulation frames and the first and second external conductive electrodes, respectively, and electrically connected to the first and second external electrodes, respectively. The first and second external conductive electrodes and the first and second internal conductive electrodes may be respectively electrically connected to one another.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Component

A multilayer ceramic component according to the exemplary embodiment in the present disclosure may include insulation frames disposed to partially enclose external electrodes of a multilayer ceramic capacitor and having an L-shape. External conductive electrodes may be disposed on external surfaces of the insulation frames, internal conductive electrodes connected to the external electrodes may be disposed on internal surfaces of the insulation frames, and the external conductive electrodes and the internal conductive electrodes may be electrically connected to each other.

In this case, conductive adhesive layers may be disposed between the internal conductive electrodes and the external electrodes.

Further, the external conductive electrodes and the internal conductive electrodes may be electrically connected to each other by via electrodes penetrating through the insulation frames. Alternatively, groove portions are formed in upper ends of the insulation frames, and conductive connection parts are disposed in the groove portions, such that the external conductive electrodes and the internal conductive electrodes may be electrically connected to each other.

Further, lower portions of the insulation frames may be disposed to be spaced apart from the external electrodes.

Figure 1:
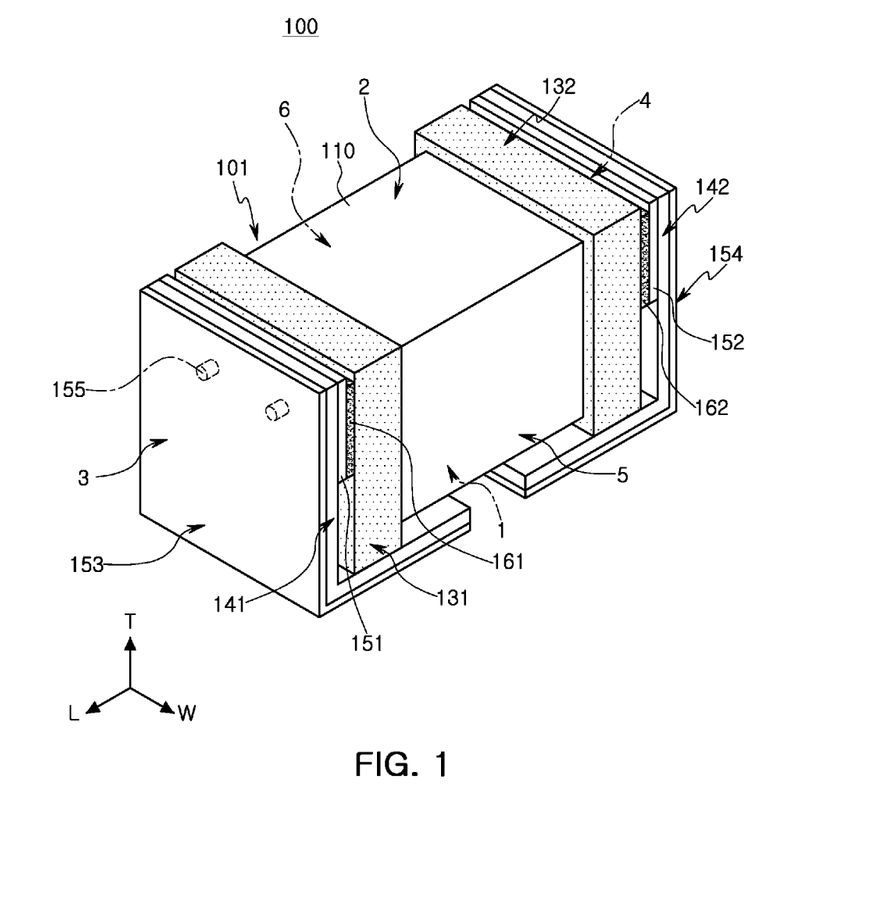
FIG. 1 is a perspective view schematically illustrating a multilayer ceramic component according to an exemplary embodiment of the present disclosure.
Figure 2:
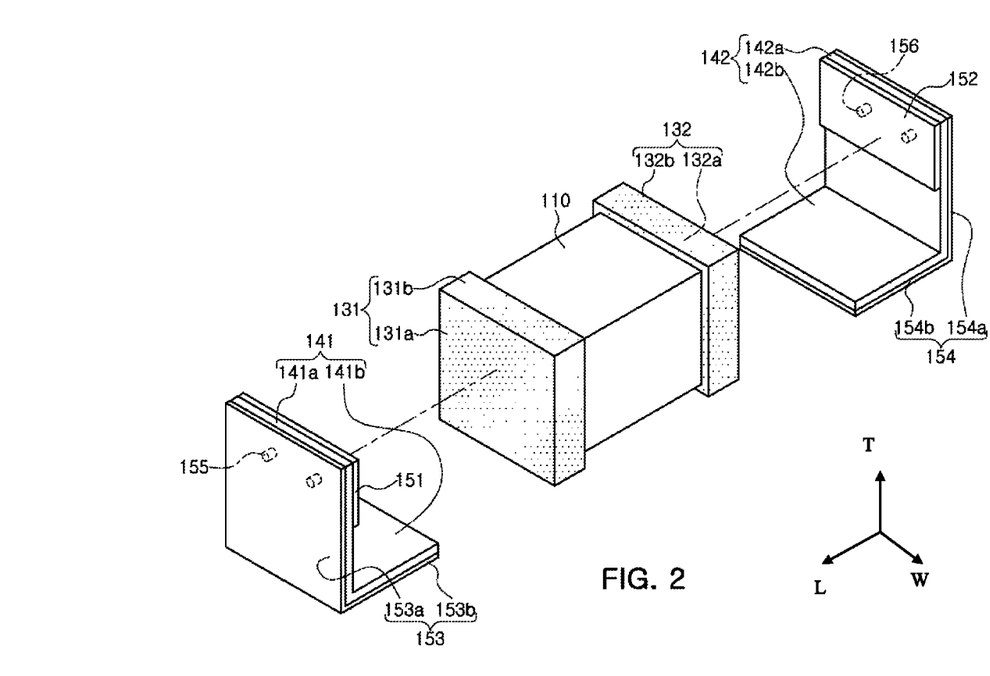
FIG. 2 is an exploded perspective view separately illustrating a multilayer ceramic capacitor of FIG. 1.
Figure 3:
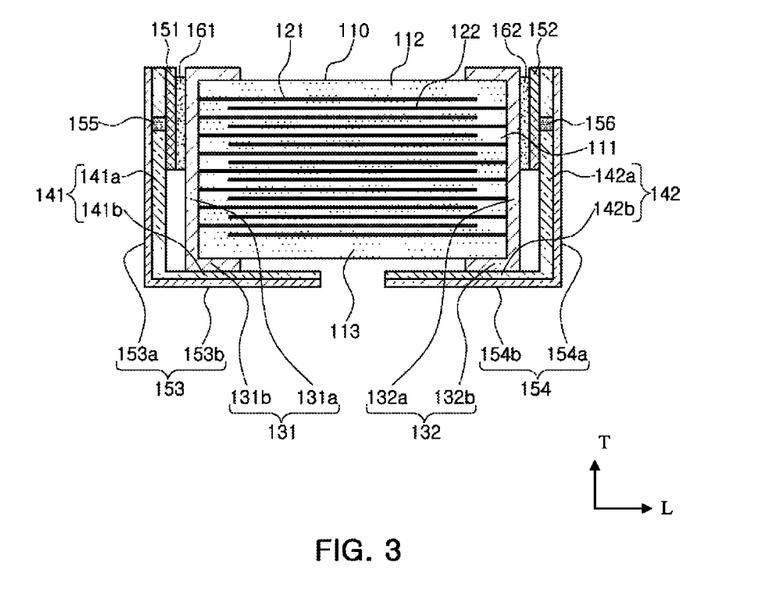
FIG. 3 is a side cross-sectional view of FIG. 1.
Figure 4:
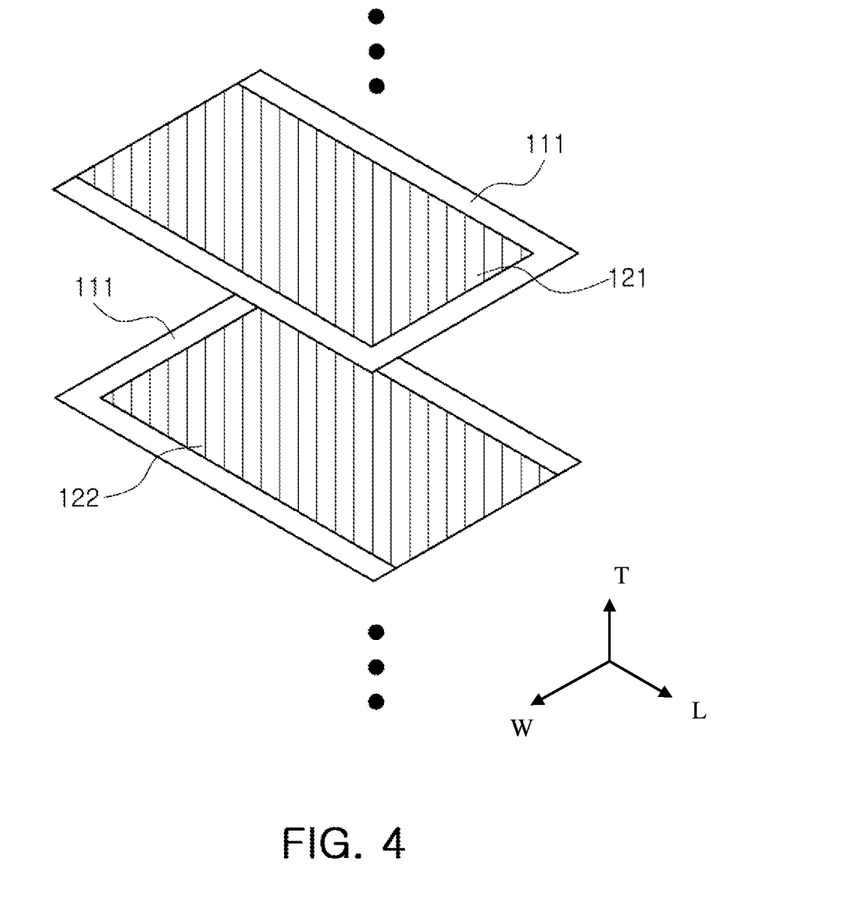
FIG. 4 is an exploded perspective view briefly illustrating an internal electrode structure of the multilayer ceramic capacitor of the multilayer ceramic component according to the exemplary embodiment of the present disclosure.

FIG. 1 is a perspective view schematically illustrating the multilayer ceramic component according to the exemplary embodiment of the present disclosure, FIG. 2 is an exploded perspective view separately illustrating the multilayer ceramic capacitor of FIG. 1, FIG. 3 is a side cross-sectional view of FIG. 1, and FIG. 4 is an exploded perspective view briefly illustrating an internal electrode structure of the multilayer ceramic capacitor of the multilayer ceramic component according to the exemplary embodiment of the present disclosure.

Referring to FIGS. 1 through 4, a multilayer ceramic component 100 according to the present exemplary embodiment may include a multilayer ceramic capacitor 101, first and second insulation frames 141 and 142, first and second external conductive electrodes 153 and 154, first and second internal conductive electrodes 151 and 152, and electrical connection portions for connecting the first and second external conductive electrodes 153 and 154 and the first and second internal conductive electrodes 151 and 152 to each other, respectively.

The multilayer ceramic capacitor 101 according to the present exemplary embodiment may include a ceramic body 110 including a plurality of dielectric layers 111 and a plurality of first and second internal electrodes 121 and 122, and first and second external electrodes 131 and 132.

The ceramic body 110 may be formed by stacking the plurality of dielectric layers 111 in a thickness (T) direction, a direction in which the first and second insulation frames 141 and 142 are disposed, and then sintering the stacked dielectric layers 111.

In this case, the respective adjacent dielectric layers 111 of the ceramic body 110 may be integrated with each other, such that boundaries therebetween may not be readily apparent.

In addition, the ceramic body 110 may have a hexahedral shape, but a shape of the ceramic body 110 is not limited thereto.

In the present exemplary embodiment, for convenience of explanation, surfaces of the ceramic body 110 opposing each other in the thickness (T) direction in which the dielectric layers 111 of the ceramic body 110 are stacked will be defined as upper surface and lower surfaces 2 and 1, surfaces of the ceramic body 110 connecting the upper and lower surfaces 2 and 1 to each other and opposing each other in a length (L) direction will be defined as first and second end surfaces 3 and 4, and surfaces perpendicularly intersecting the first and second end surfaces 3 and 4 and opposing each other in a width (W) direction will be defined as first and second side surfaces 5 and 6.

In addition, an upper cover layer 112 having a predetermined thickness may be disposed on a first or second internal electrode disposed uppermost in the ceramic body 110, and a lower cover layer 113 may be formed below a first or second internal electrode disposed lowermost in the ceramic body 110.

The upper and lower cover layers 112 and 113 may be formed of the same material as that of the dielectric layer 111 and be formed by stacking at least one dielectric layer that does not include internal electrodes on the uppermost internal electrode of the ceramic body 110 and below the lowermost internal electrode thereof, respectively.

The dielectric layer 111 may contain a ceramic material having high permittivity such as a $BaTiO_3$-based ceramic powder, or the like, but the material of the dielectric layer 111 is not limited thereto.

The $BaTiO_3$-based ceramic powder may be, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$ in which Ca, Zr, and the like, are partially solid-dissolved in $BaTiO_3$, or the like, but an example of the $BaTiO_3$-based ceramic powder is not limited thereto.

In addition, if necessary, at least one of ceramic additives, an organic solvent, a plasticizer, a binder, and a dispersant may be further contained in the dielectric layer 111.

As the ceramic additive, for example, a transition metal oxide or carbide, rare earth elements, magnesium (Mg), aluminum (Al), or the like, may be used.

After the first and second internal electrodes 121 and 122 are formed on ceramic sheets forming the dielectric layers 111 and stacked in the thickness direction, the first and second internal electrodes 121 and 122 may be alternately disposed in the ceramic body 110 in the thickness direction, with respective dielectric layers 111 interposed therebetween.

The first and second internal electrodes 121 and 122 as described above, a pair of electrodes having different polarities, may be disposed to face each other in a direction in which the dielectric layers 111 are stacked, and may be electrically insulated from each other by the dielectric layer interposed therebetween.

One ends of the first and second internal electrodes 121 and 122 may be exposed to the first and second end surfaces 3 and 4 of the ceramic body 110 in the length direction, respectively.

In addition, end portions of the first and second internal electrodes 121 and 122 exposed to the first and second end surfaces 3 and 4 of the ceramic body 110 in the length direction may be electrically connected to the first and second external electrodes 131 and 132 disposed at the first and second end surfaces 3 and 4 of the ceramic body 110 in the length direction, respectively.

In this case, the first and second internal electrodes 121 and 122 may be formed of a conductive metal, for example, nickel (Ni), a nickel (Ni) alloy, or the like. However, a material of the first and second internal electrodes 121 and 122 is not limited thereto.

Through the above-mentioned configuration, when a voltage having a predetermined level is applied to the first and second external electrodes 131 and 132, electric charges are accumulated between the first and second internal electrodes 121 and 122 facing each other. In this case, capacitance of the multilayer ceramic capacitor 101 may be in proportion to an area of overlap between the first and second internal electrodes 121 and 122 overlapping each other in the stacking direction of the dielectric layers 111.

The first and second external electrodes 131 and 132 may be disposed on opposite end surfaces of the ceramic body 110 in the length direction, respectively.

In addition, the first and second external electrodes 131 and 132 may include first and second connection portions 131a and 132a and first and second band portions 131b and 132b, respectively.

The first and second connection portions 131a and 132a may be disposed on the first and second end surfaces 3 and 4 of the ceramic body 110 in the length direction and may be electrically connected to exposed end portions of the first and second internal electrodes 121 and 122, respectively.

The first and second band portions 131b and 132b may be portions extended from the first and second connection portions 131a and 132a, respectively, to cover a portion of the lower surface, a mounting surface of the ceramic body 110 or portions of a circumferential surface of the ceramic body 110, and may serve to improve adhesive strength of the first and second external electrodes 131 and 132.

Here, plating layers (not illustrated) may be formed on the first and second external electrodes 131 and 132.

The plating layers may include first and second nickel (Ni) plating layers, respectively formed on the first and second external electrodes 131 and 132 and first and second tin (Sn) plating layers, respectively formed on the first and second nickel plating layers, as an example.

The first insulation frame 141 may include a first horizontal insulation portion 141b and a first vertical insulation portion 141a.

The first horizontal insulation portion 141b may be disposed below the ceramic body 110, more specifically, below a lower surface of the first band portion 131b of the first external electrode 131.

In this case, if necessary, the first horizontal insulation portion 141b may be disposed to be spaced apart from the first band portion 131b.

Further, the first vertical insulation portion 141a may be bent perpendicularly from one end portion of the first horizontal insulation portion 141b to thereby be extended, and may be disposed to be spaced apart from the first connection portion 131a of the first external electrode 131 in the length direction.

The first insulation frame 141 configured as described above may have a substantially L shape.

The second insulation frame 142 may include a second horizontal insulation portion 141b and a second vertical insulation portion 142a.

The second horizontal insulation portion 142b may be disposed below the ceramic body 110, more specifically, below a lower surface of the second band portion 132b of the second external electrode 132.

In this case, if necessary, the second horizontal insulation portion 142b may be disposed to be spaced apart from the second band portion 132b.

Further, the second vertical insulation portion 142a may be bent perpendicularly from one end portion of the second horizontal insulation portion 142b to thereby be extended, and may be disposed to be spaced apart from the second connection portion 132a of the second external electrode 132 in the length direction.

The second insulation frame 141 configured as described above may have a substantially L shape so as to face the first insulation frame 141.

The first and second insulation frames 141 and 142 may be formed using an electrical insulation material having excellent heat resistance and insulation properties and having flexibility suitable for bending in order to form the first and second horizontal insulation portions 141b and 142b and the first and second vertical insulation portions 141a and 142a. For example, the first and second insulation frames 141 and 142 may be formed of a polyimide resin.

Since the first and second insulation frames 141 and 142 according to the present exemplary embodiment are insulators, when sizes of internal conductive electrodes to be described below are adjusted, a bonding area between the multilayer ceramic capacitor 101 and the first and second insulation frames 141 and 142 may be easily controlled. Therefore, an area in which piezoelectric vibrations generated in the multilayer ceramic capacitor 101 are transferred through the first and second insulation frames 141 and 142 and the external conductive electrodes 153 and 154 may be easily adjusted.

Therefore, it may be easy to control the transfer of vibrations to the board, and when sizes of the external conductive electrodes are adjusted at portions at which solders are formed, a height of the solders may be easily controlled.

The first external conductive electrode 153 may include a first horizontal conductive portion 153*b* and a first vertical conductive portion 153*a*.

The first horizontal conductive portion 153*b* may be disposed on an external surface (a lower surface) of the first horizontal insulation portion 141*b* of the first insulation frame 141, and the first vertical conductive portion 153*a* may be extended perpendicularly from one end portion of the first horizontal conductive portion 153*b* and disposed on an external surface of the first vertical insulation portion 141*a* of the first insulation frame 141.

In this case, the first horizontal conductive portion 153*b* may be surface-treated by nickel/tin or nickel/gold plating, or the like, so as to have excellent contact properties with the solders at the time of mounting the multilayer ceramic component on a board.

The first external conductive electrode 153 configured as described above may have a substantially L-shape covering the external surface of the first insulation frame 141.

The second external conductive electrode 154 may include a second horizontal conductive portion 154*b* and a second vertical conductive portion 154*a*.

The second horizontal conductive portion 154*b* may be disposed on an external surface (a lower surface) of the second horizontal insulation portion 142*b* of the second insulation frame 142, and the second vertical conductive portion 154*a* may be extended perpendicularly from one end portion of the second horizontal conductive portion 154*b* and disposed on an external surface of the second vertical insulation portion 142*a* of the second insulation frame 142.

In this case, the second horizontal conductive portion 154*b* may be surface-treated by nickel/tin or nickel/gold plating, or the like, so as to have excellent contact properties with the solders at the time of mounting the multilayer ceramic component on a board.

The second external conductive electrode 154 configured as described above may have a substantially L-shape covering the external surface of the second insulation frame 142.

Further, the first and second external conductive electrodes 153 and 154 may be formed of a metal material having excellent conductivity. For example, the first and second external conductive electrodes 153 and 154 may be formed of copper, or the like.

In addition, at the time of mounting the multilayer ceramic component on the board, the solder may be controlled to have a low height by forming insulation layers formed of a material such as an epoxy resin, or the like, or further partially forming conductive electrodes on external surfaces of the first and second vertical conductive portions 153*a* and 154*a*, when needed.

The first internal conductive electrode 151 may be disposed on an internal surface of the first vertical insulation portion 141*a* of the first insulation frame 141 and electrically connected to the first connection portion 131*a* of the first external electrode 131.

The second internal conductive electrode 152 may be disposed on an internal surface of the second vertical insulation portion 142*a* of the second insulation frame 142 and electrically connected to the second connection portion 132*a* of the second external electrode 132.

Further, the first and second internal conductive electrodes 151 and 152 may be formed of a metal material having excellent conductivity, which is the same material as that of the first and second external conductive electrodes 153 and 154. For example, the first and second internal conductive electrodes 151 and 152 may be formed of copper, or the like.

In this case, the first and second internal conductive electrodes 151 and 152 may be formed to have a size smaller than that of the first and second connection portions 131*a* and 132*a* of the first and second external electrodes 131 and 132. In addition, the first and second internal conductive electrodes 151 and 152 may be configured so as to only be bonded to upper portions of the first and second connection portions 131*a* and 132*a*, respectively.

When bonding areas of the first and second internal conductive electrodes 151 and 152 are decreased as described above, while lower portions of the first and second vertical insulation portions 141*a* and 142*a* of the first and second insulation frames 141 and 142 and lower portions of the first and second connection portions 131*a* and 132*a* of the first and second external electrodes 131 and 132 may be spaced apart from each other at a predetermined interval by a thickness of the first and second internal conductive electrodes 151 and 152, and space portions are provided therebetween, respectively, and an area in which vibrations of the first and second external electrodes 131 and 132 of the multilayer ceramic capacitor 101 are transferred may be decreased. Therefore, the transferring of vibrations to the board by piezoelectric properties of the multilayer ceramic capacitor 101 may be decreased, such that acoustic noise may be decreased.

The electrical connection portions may be, for example, first and second via electrodes 155 and 156 penetrating through the first and second vertical insulation portions 141*a* and 142*a* of the first and second insulation frames 141 and 142, respectively.

The first and second vertical conductive portions 153*a* and 154*a* of the first and second external conductive electrodes 153 and 154 and first and second internal conductive electrodes 151 and 152 may contact opposite exposed end portions of the first and second via electrodes 155 and 156 to thereby be electrically connected to each other, respectively.

Figure 5:
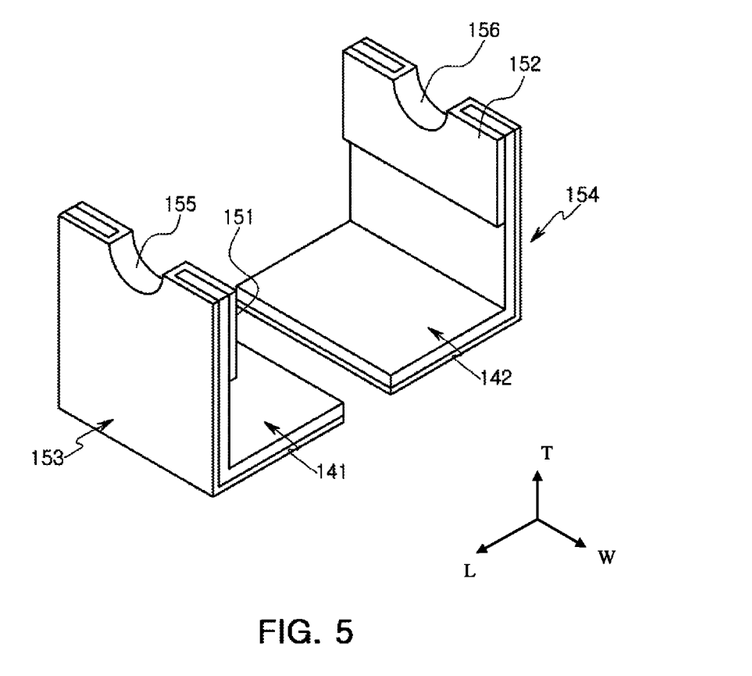
FIG. 5 is an exploded perspective view illustrating another example of electrical connection portions in the multilayer ceramic component according to an exemplary embodiment of the present disclosure.

Referring to FIG. 5, as another example of the electrical connection portions, first and second groove portions may be formed to be concave in upper ends of the first and second vertical insulation portions 141*a* and 142*a* of the first and second insulation frames 141 and 142, and first and second conductive connection parts 155 and 156 formed of a conductive material may be formed in the first and second groove portions, such that the first and second vertical conductive portions 153*a* and 154*a* of the first and second external conductive electrodes 153 and 154 and the first and second internal conductive electrodes 151 and 152 may be connected to each other by the first and second conductive connection parts 155 and 156 as described above, respectively.

Meanwhile, first and second conductive adhesive layers 161 and 162 may be disposed between the first and second connection portions 131*a* and 132*a* of the first and second external electrodes 131 and 132 and the first and second internal conductive electrodes 151 and 152, respectively, in order to improve adhesive force. In this case, the lower portions of the first and second vertical insulation portions 141a and 142a of the first and second insulation frames 141 and 142 and the lower portions of the first and second connection portions 131a and 132a of the first and second external electrodes 131 and 132 may be spaced apart from each other at another predetermined interval by a sum of the thickness of the first and second internal conductive electrodes 151 and 152 and a thickness of the first and second conductive adhesive layers 161 and 162.

The first and second conductive adhesive layers 161 and 162 may be formed of, for example, a high-melting point solder or a conductive paste. However, the material of the first and second conductive adhesive layers 161 and 162 is not limited thereto.

Modified Exemplary Embodiment

Figure 6:
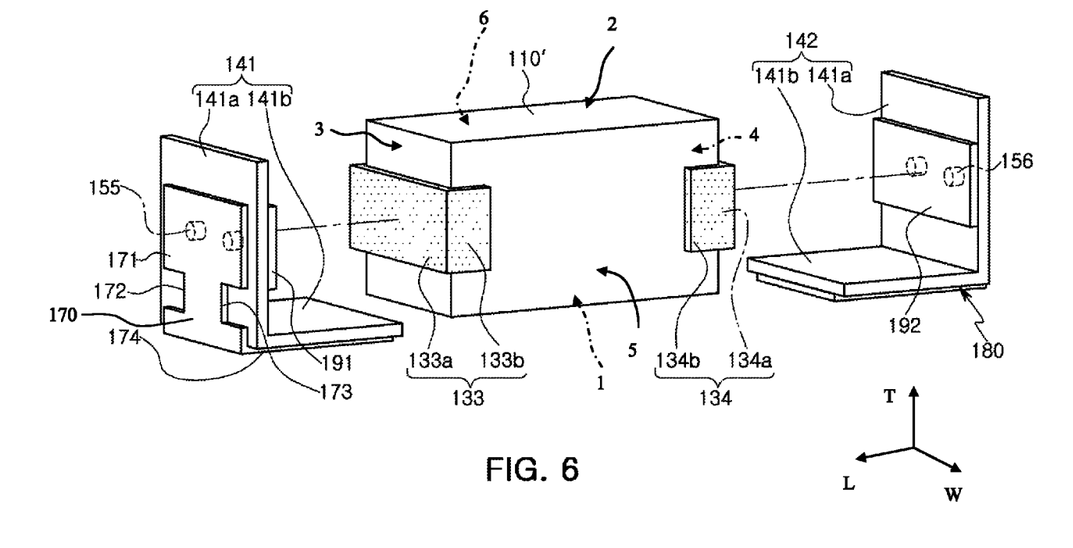
FIG. 6 is an exploded perspective view separately illustrating a multilayer ceramic capacitor in a multilayer ceramic component according to another exemplary embodiment of the present disclosure.
Figure 7:
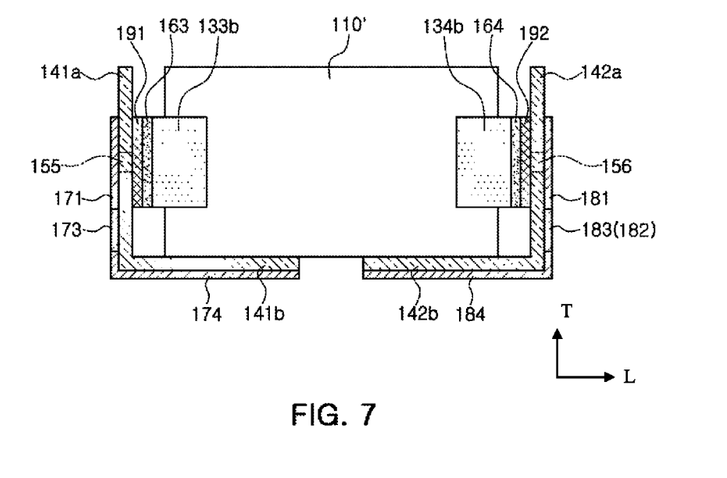
FIG. 7 is a side cross-sectional view illustrating a coupled state of the multilayer ceramic capacitor of FIG. 6.
Figure 8:
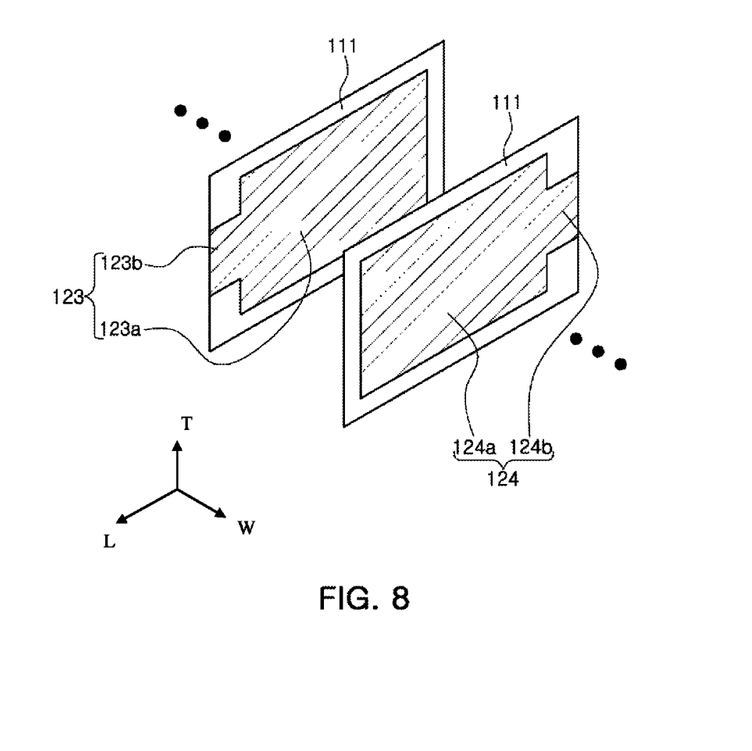
FIG. 8 is an exploded perspective view briefly illustrating an internal electrode structure of the multilayer ceramic capacitor of the multilayer ceramic component according to another exemplary embodiment of the present disclosure.

FIG. 6 is an exploded perspective view separately illustrating a multilayer ceramic capacitor in a multilayer ceramic component according to another embodiment in the present disclosure, FIG. 7 is a side cross-sectional view illustrating a coupled state of the multilayer ceramic capacitor of FIG. 6, and FIG. 8 is an exploded perspective view briefly illustrating an internal electrode structure of the multilayer ceramic capacitor of the multilayer ceramic component according to another exemplary embodiment in the present disclosure.

Here, detailed descriptions of elements similar to those of previous exemplary embodiments in the present disclosure will be omitted in order to avoid an overlapping descriptions, and only additional features will be described in detail.

Referring to FIGS. 6 through 8, a ceramic body 110' according to the present exemplary embodiment may be configured by stacking a plurality of dielectric layers 111 in a width (W) direction perpendicular to a direction in which first and second horizontal insulation portions 141b and 142b of first and second insulation frames 141 and 142 are disposed.

In this case, after first and second internal electrodes 123 and 124 are formed on ceramic sheets forming the dielectric layers 111 and stacked in the width direction, the first and second internal electrodes 123 and 124 may be alternately disposed in the ceramic body 110' in the width direction, with respective dielectric layers 111 interposed therebetween, by sintering.

Further, the first and second internal electrodes 123 and 124 may include first and second body portions 123a and 124a overlapping each other in the width direction and first and second lead portions 123b and 124b extended from the first and second body portions 123a and 124a to thereby be exposed to first and second end surfaces 3 and 4 of the ceramic body 110' in the length direction.

Here, the first and second lead portions 123b and 124b may be formed to have a width narrower than that of the first and second body portions 123a and 124a.

Meanwhile, cover layers (not illustrated) having a predetermined thickness may be disposed outside first or second internal electrodes positioned at the outermost portions of the ceramic body 110' in the width direction, respectively.

First and second external electrodes 133 and 134 may be disposed to be connected to the first and second lead portions 123b and 124b on portions of the first and second end surfaces 3 and 4 of the ceramic body 110 in the length direction, respectively.

In this case, the first and second external electrodes 133 and 134 may be formed to have a small size in the thickness direction as compared to the first and second end surfaces 3 and 4 of the ceramic body 110' in the length direction in consideration of areas of the first and second lead portions 123b and 124b exposed to the first and second end surfaces 3 and 4 of the ceramic body 110' in the length.

Further, if necessary, the first and second external electrodes 133 and 134 may be extended to portions of first and second side surfaces 5 and 6 of the ceramic body 110' in the width direction, respectively, in order to improve adhesive force.

In this case, sizes of the first and second internal conductive electrodes 191 and 192 may be adjusted in consideration of bonding areas between the first and second internal conductive electrodes 191 and 192 and the first and second external electrodes 133 and 134.

First and second external conductive electrodes 170 and 180 may include first and second horizontal conductive portions 174 and 184 and first and second vertical conductive portions 171 and 181, wherein cut portions 172, 173, 182, and 183 may be formed in the first and second vertical conductive portions.

When solders are attached to the first and second external conductive electrodes 170 and 180 at the time of mounting the multilayer ceramic component on a board, acoustic noise is increased in proportion to an amount of the attached solders.

According to the present exemplary embodiment, acoustic noise may be further decreased by forming the cut portions 172, 173, 182, and 183 in the first and second vertical conductive portions 171 and 181 to decrease areas of the first and second vertical conductive portions 171 and 181 to which the solders are attached.

Further, when the cut portions 172, 173, 182, and 183 are formed in both sides of the first and second vertical conductive portions 171 and 181 in the length direction of the first and second vertical conductive portions 171 and 181, the cut portions 172 and 173, and 182 and 183 facing each other in the first and second vertical conductive portions 171 and 181 of the first and second external conductive electrodes 170 and 180 may suppress the solders from being elongated along the first and second vertical conductive portions 171 and 181 of the first and second external conductive electrodes 170 and 180 in a height direction thereof. In addition, the cut portions 172, 173, 182, and 183 may decrease areas of the first and second vertical conductive portions 171 and 181 to decrease rigidity of the first and second external conductive electrodes 170 and 180, such that elastic deformation may easily occur, and thus, an effect of removing acoustic noise may be further improved.

Meanwhile, although the case a pair of cut portions are formed to face each other in both sides of the first and second vertical conductive portions 171 and 181 in the length direction thereof is illustrated and described in the present exemplary embodiment, the cut portions are not limited thereto. That is, formation positions of the cut portions may be variously changed. For example, the cut portions may be additionally formed in central portions of the first and second vertical conductive portions.

Board Having Multilayer Ceramic Component

Figure 9:
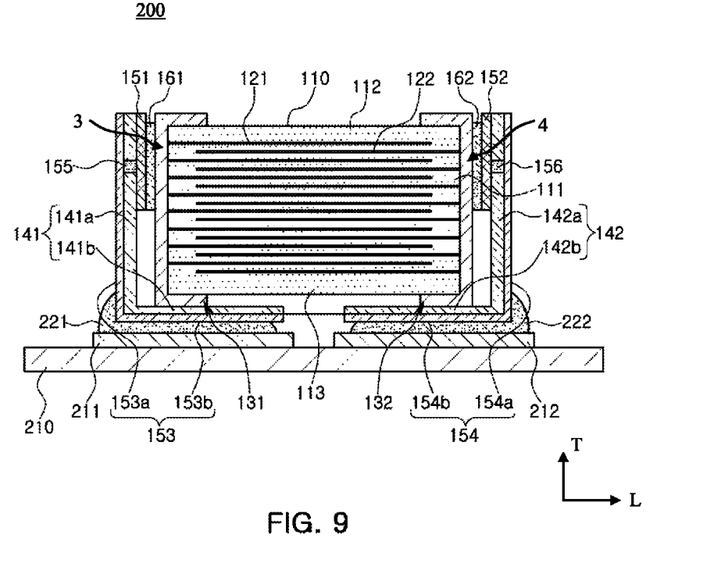
FIG. 9 is a side cross-sectional view illustrating aboard in which the multilayer ceramic component of FIG. 1 is mounted on a circuit board.

Referring to FIG. 9, a board 200 having the multilayer ceramic component 100, according to an exemplary embodiment in the present disclosure, may include a circuit board 210 on which the multilayer ceramic component 100 is horizontally mounted, and first and second electrode pads 211 and 212 formed on an upper surface of the circuit board 210 to be spaced apart from each other.

In this case, the multilayer ceramic component 100 may be electrically connected to the circuit board 210 by solders 221 and 222 in a state in which the first and second horizontal conductive portions 141b and 142b of the first and second external conductive electrodes 141 and 142 are positioned to contact the first and second electrode pads 221 and 222, respectively.

Here, sizes of the first and second electrode pads 221 and 222 may be an indicator for determining an amount of the solders 221 and 222 connecting the first and second horizontal conductive portions 141b and 142b of the multilayer ceramic component to the first and second electrode pads 211 and 212, and the level of acoustic noise may be adjusted depending on the amounts of the solders 221 and 222.

When voltages having different polarities are applied to the first and second external electrodes 131 and 132 formed on the first and second end surfaces 3 and 4 of the ceramic body 110 in the length direction in a state in which the multilayer ceramic capacitor 101 is mounted on the circuit board 210, the ceramic body 100 may be expanded and contracted in the thickness direction due to an inverse piezoelectric effect of the dielectric layers 111, and the first and second end surfaces 3 and 4 of the ceramic body 110 in the length direction on which the first and second external electrodes 131 and 132 are formed may be contracted and expanded as opposed to the expansion and the contraction of the ceramic body 110 in the thickness direction due to the Poisson effect.

This contraction and expansion may generate vibrations, and these vibrations may be transferred to the circuit board 210 from the first and second external electrodes 131 and 132, such that sound is reflected from the circuit board 210, thereby generating acoustic noise.

According to the present exemplary embodiment, mechanical vibrations generated by piezoelectric properties of the multilayer ceramic capacitor 101 may be partially absorbed by elastic force of the first and second external conductive electrodes 153 and 154 and the first and second insulation frames 141 and 142, which may decrease an amount of vibrations transferred to the circuit board 210, such that acoustic noise may be decreased.

Further, the first and second external conductive electrodes 153 and 154 and the first and second insulation frames 141 and 142 may absorb mechanical stress generated by warpage of the circuit board 210 and external impacts to allow the stress not to be transferred to the multilayer ceramic capacitor 101, such that cracks may be prevented from occurring in the multilayer ceramic capacitor.

In addition, according to the present exemplary embodiment, since sufficient elastic force may be obtained by the first and second external conductive electrodes 153 and 154 and the first and second insulation frames 141 and 142, even though the first and second horizontal insulation portions 141b and 142b of the first and second insulation frames 141 and 142 and the lower surface of the ceramic body 110 contact each other or are spaced apart from each other, a minimal interval therebetween may be maintained, such that a height of a product may be further decreased.

As set forth above, according to exemplary embodiments in the present disclosure, acoustic noise may be decreased by absorbing vibrations transferred through the external electrodes of the multilayer ceramic capacitor using elastic force of the external conductive electrodes and insulation frames.

While exemplary embodiments have been shown and described above, it will be apparent to those skilled in the art that modifications and variations could be made without departing from the scope of the present invention as defined by the appended claims.

What is claimed is:

1. A multilayer ceramic component comprising:
a multilayer ceramic capacitor including a ceramic body including a plurality of first and second internal electrodes alternately exposed to opposite end surfaces of the ceramic body in a length direction with respective dielectric layers interposed between the plurality of first and second internal electrodes, and first and second external electrodes disposed to be connected to the first and second internal electrodes, respectively, on the opposite end surfaces of the ceramic body in the length direction;
first and second insulation frames respectively including first and second horizontal insulation portions disposed on portions of the ceramic body in a thickness direction, and first and second vertical insulation portions extended perpendicularly from end portions of the first and second horizontal insulation portions of the first and second insulation frames, respectively, and disposed on the opposite end surfaces of the ceramic body in the length direction, respectively;
first and second external conductive electrodes respectively including first and second horizontal conductive portions disposed on external surfaces of the first and second horizontal insulation portions of the first and second insulation frames, respectively, and first and second vertical conductive portions disposed on external surfaces of the first and second vertical insulation portions of the first and second insulation frames, respectively;
first and second internal conductive electrodes disposed on internal surfaces of the first and second vertical insulation portions of the first and second insulation frames and connected to the first and second external electrodes, respectively; and
electrical connection portions connecting the first and second vertical conductive portions of the first and second external conductive electrodes and the first and second internal conductive electrodes to each other, respectively,
wherein the first and second external electrodes respectively comprise first and second connection portions formed on the opposite end surfaces of the ceramic body in the length direction, respectively, and first and second band portions extended from the first and second connection portions to cover portions of a circumferential surface of the ceramic body, respectively,
the first and second internal conductive electrodes are bonded to upper portions of the first and second connection portions, respectively, and space portions are provided between lower portions of the first and second vertical insulation portions of the first and second insulation frames and lower portions of the first and second connection portions of the first and second external electrodes, respectively,
the electrical connection portions are first and second via electrodes penetrating through the first and second vertical insulation portions of the first and second insulation frames, respectively, and
the first and second external conductive electrodes further comprise cut portions formed in the first and second vertical conductive portions, respectively.

2. The multilayer ceramic component of claim 1, further comprising first and second conductive adhesive layers disposed between the first and second internal conductive electrodes and the first and second connection portions of the first and second external electrodes, respectively.

3. The multilayer ceramic component of claim 2, wherein the first and second conductive adhesive layers are formed of a high-melting point solder or conductive paste.

4. The multilayer ceramic component of claim 1, wherein the electrical connection portions comprise first and second groove portions formed in upper ends of the first and second vertical insulation portions of the first and second insulation frames, respectively, and first and second conductive connection parts disposed in the first and second groove portions, respectively.

5. The multilayer ceramic component of claim 1, wherein the ceramic body comprises a plurality of dielectric layers stacked in the ceramic body in a direction parallel to a direction in which the first and second horizontal insulation portions of the first and second insulation frames are disposed.

6. The multilayer ceramic component of claim 1, wherein the ceramic body comprises a plurality of dielectric layers stacked in the ceramic body in a direction perpendicular to a direction in which the first and second horizontal insulation portions of the first and second insulation frames are disposed.

7. The multilayer ceramic component of claim 1, wherein the first and second internal electrodes comprise first and second lead portions extended to be alternately exposed to both end surfaces of the ceramic body in the length direction, and
the first and second external electrodes are disposed to be connected to the first and second lead portions, respectively, on portions of the opposite end surfaces of the ceramic body in the length direction.

8. The multilayer ceramic component of claim 7, wherein the first and second external electrodes are extended to portions of opposite surfaces of the ceramic body in a width direction, respectively.

9. A board having a multilayer ceramic component, the board comprising:
a circuit board on which first and second electrode pads are provided; and
the multilayer ceramic component of claim 1, mounted on the circuit board such that the first and second horizontal conductive portions of the first and second external conductive electrodes are connected to the first and second electrode pads.

10. A multilayer ceramic component comprising:
a multilayer ceramic capacitor including a ceramic body including a plurality of first and second internal electrodes alternately exposed to opposite end surfaces of the ceramic body in a length direction with respective dielectric layers interposed between the plurality of first and second internal electrodes, and first and second external electrodes disposed on the opposite end surfaces of the ceramic body which the plurality of the first and second internal electrodes are exposed to;
first and second external conductive electrodes disposed on the first and second external electrodes, respectively;
first and second electrical insulation frames disposed between the first and second external electrodes and the first and second external conductive electrodes, respectively; and
first and second internal conductive electrodes disposed between the first and second electrical insulation frames and the first and second external conductive electrodes, respectively, and electrically connected to the first and second external electrodes, respectively,
wherein the first external conductive electrode and the first internal conductive electrode are respectively electrically connected to one another through a first via electrode penetrating through the first insulation frame, and the second external conductive electrode and the second internal conductive electrode are electrically connected to one another through a second via electrode penetrating through the second insulation frame,
the first and second external electrodes respectively comprise first and second connection portions formed on the opposite end surfaces of the ceramic body in the length direction, respectively, and first and second band portions extended from the first and second connection portions to cover portions of a circumferential surface of the ceramic body, respectively,
the first and second internal conductive electrodes are bonded to upper portions of the first and second connection portions, respectively, and space portions are provided between lower portions of the first and second insulation frames and lower portions of the first and second connection portions of the first and second external electrodes, respectively, and
the first and second external conductive electrodes further comprise cut portions.

11. The multilayer ceramic component of claim 10, wherein:
the first external electrode, the first electrical insulation frame, and the first external conductive electrode each include a bent portion cover a portion of a side surface of the ceramic body,
the second external electrode, the second electrical insulation frame, and the second external conductive electrode each include a bent portion cover another portion of the side surface of the ceramic body, and
the side surface of the ceramic body connects the opposite end surfaces of the ceramic body to each other.

12. The multilayer ceramic component of claim 10, wherein the first and second internal conductive electrodes respectively partially cover surfaces of the first and second external electrodes which are perpendicular to the length direction of the ceramic body.

* * * * *